United States Patent [19]
Green et al.

[11] 4,135,102
[45] Jan. 16, 1979

[54] HIGH PERFORMANCE INVERTER CIRCUITS

[75] Inventors: Robert S. Green, Richardson; Harold W. Dozier; Vernon G. McKenny, both of Carrollton, all of Tex.

[73] Assignee: Mostek Corporation, Carrollton, Tex.

[21] Appl. No.: 816,363

[22] Filed: Jul. 18, 1977

[51] Int. Cl.² .................... H03K 19/08; H03K 19/40; H03K 17/04
[52] U.S. Cl. .................... 307/205; 307/213; 307/214; 307/251
[58] Field of Search ................ 307/205, 214, 213, 251

[56] References Cited
U.S. PATENT DOCUMENTS

| | | | |
|---|---|---|---|
| 3,700,981 | 10/1972 | Masuhara et al. | 307/205 X |
| 3,775,693 | 11/1973 | Proebsting | 307/205 X |
| 3,851,189 | 11/1974 | Moyer | 307/279 |
| 3,913,026 | 10/1975 | Koehler | 58/23 A X |
| 3,969,633 | 7/1976 | Paluck et al. | 307/205 |
| 4,042,839 | 8/1977 | Araki | 307/214 X |

*Primary Examiner*—Larry N. Anagnos
*Attorney, Agent, or Firm*—James J. Mullen

[57] ABSTRACT

The invention disclosed herein is a high performance inverter circuit using MOSFETs having varying threshold voltages produced by selectively varying ion implantation doses in the channels of the MOSFETs and using a slightly depletion type MOSFET, rather than a conventional depletion type, in the output stage.

2 Claims, 5 Drawing Figures

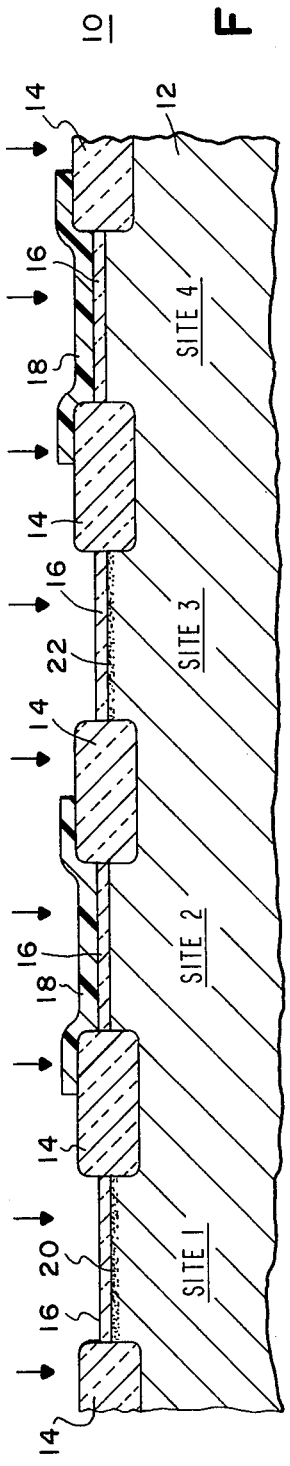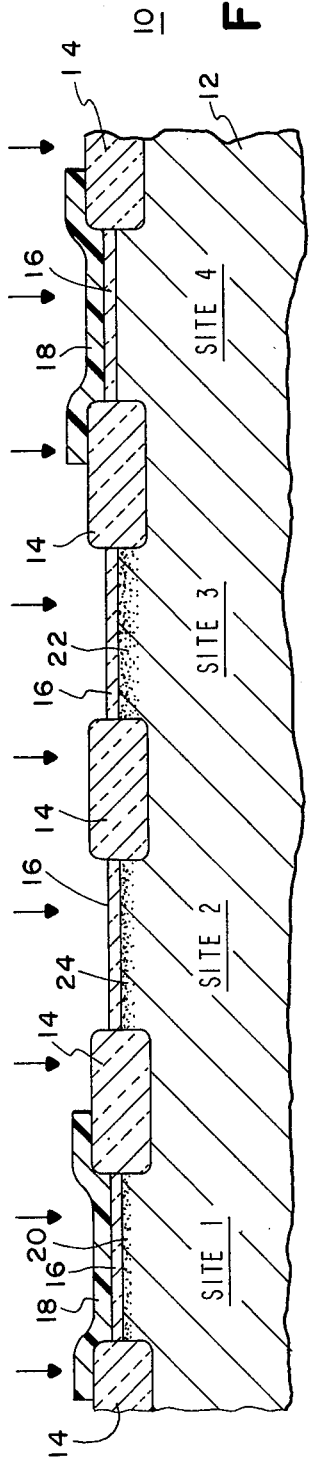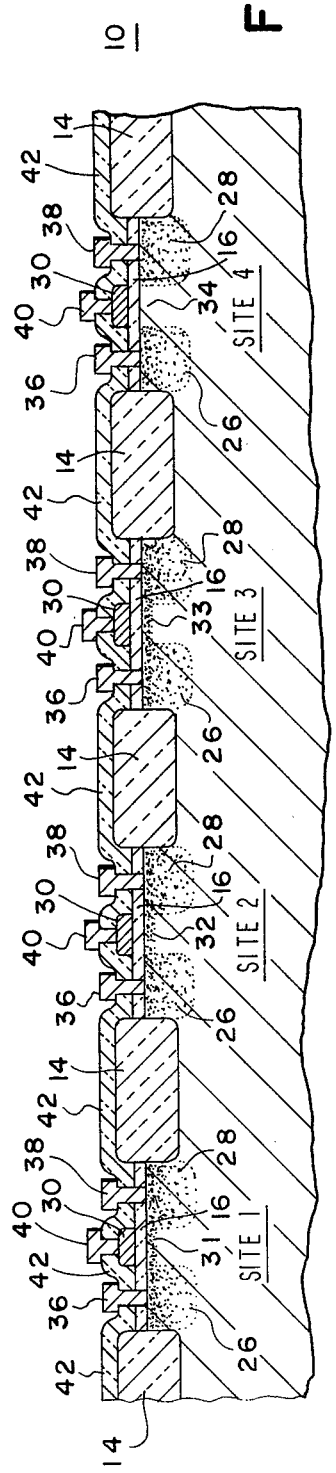

HIGH PERFORMANCE INVERTER CIRCUITS

BACKGROUND OF THE INVENTION

The present invention pertains to integrated circuits and particularly to a method of making integrated circuits having a plurality of metal-oxide-semiconductor field-effect transistors that have varying characteristics on a single semiconductor substrate using ion implantation to vary the characteristics thereof.

A method for adjusting the threshold voltage of a MOSFET using ion implantation is described in U.S. Pat. No. 3,898,105. Both enhancement mode and depletion mode MOSFETs can be made as described therein by selectively masking enhancement mode sites against a dose of ions that causes transistors formed in the unmasked sites to operate in the depletion mode. The present invention employs the techniques as generally described in the cited patent in a new and different manner to create circuits with substantially lower response times than were heretofore possible.

The present invention is particularly applicable to improvements in the implementation of certain prior art inverter circuits. A detailed description of such prior art circuits is given in U.S. Pat. No. 3,775,693.

SUMMARY OF THE INVENTION

An integrated circuit device having a plurality of MOSFETs is produced in accordance with the present invention by varying the threshold voltage of selected MOSFETs using at least two selective ion-implant doses, wherein the channels of some of the MOSFETs are implanted with only the first dose, the channels of some other MOSFETs are implanted with only the second dose, the channels of still other MOSFETs are implanted with both doses, and the channels of other remaining MOSFETs are implanted with neither the first nor the second dose of ions.

The novel features believed characteristic of the invention are set forth in the appended claims. The nature of the invention, however, as well as its essential features and advantages, may be understood more fully upon consideration of illustrative embodiments when read in conjunction with the accompanying drawing, wherein:

BRIEF DESCRIPTION OF THE DRAWINGS

FIGS. 1–3 are schematic sectional views illustrating a portion of an integrated circuit device of the present invention at pertinent stages in the inventive process; and, FIGS. 4 and 5 are circuit applications of the present invention.

DESCRIPTION OF THE PREFERRED EMBODIMENTS

Figure 4:
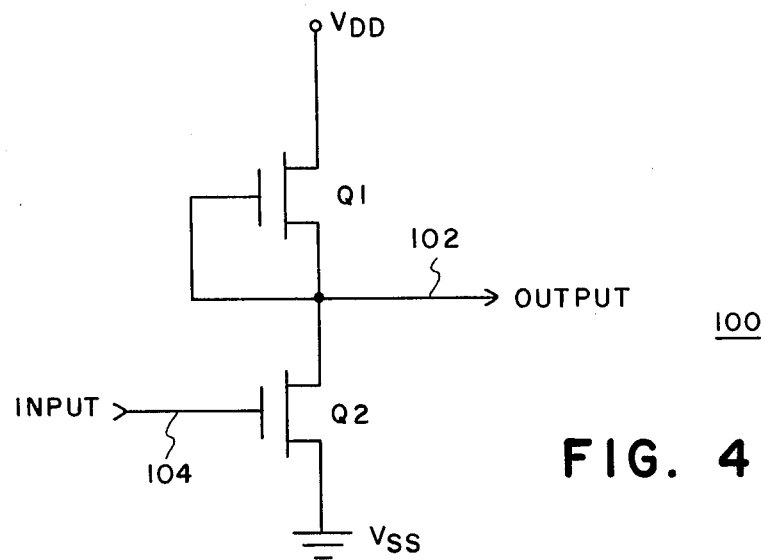

FIG. 1 illustrates a portion of an integrated circuit device of the present invention, indicated generally by reference numeral 10, at an intermediate stage in a manufacturing process. The manufacturing techniques for producing the structure of FIG. 1 may be any of various conventional techniques known in the art. The device 10 comprises a substrate 12, which by way of example is P-type silicon. Those skilled in the art will appreciate that the present invention is applicable to semiconductor materials other than silicon as well as to the formation of complementary devices using an N-type semiconductor material for the substrate 12. Relatively thick oxide layers 14, which are referred to collectively as the field oxide, are formed in the substrate 12 preferably using known isoplanar techniques. Isolated between field oxide layers 14 are four sites where transistors are in the process of being formed at the stage shown in FIG. 1. It is to be understood that to carry out the inventive method it is not necessary that the four sites shown be arranged in any particular relationship to each other; rather, each of the four sites is representative of a plurality of similar sites wherein transistors formed therein may be interconnected in a variety of ways to achieve new functional results as will hereinafter be described. Disposed on the substrate 12 above each site are relatively thin oxide layers 16, which are preferably thermally grown from the substrate 12 after formation of the field oxide 14. Each of the oxide layers 16 in the sites will serve as the gate oxide of a MOSFET to be formed in subsequent steps.

In accordance with the inventive method, two groups of sites are masked preferably using a photoresist material 18 capable of shielding the substrate from ion implantation as described in U.S. Pat. No. 3,898,105. Representative of the two groups of sites that are masked in such manner are sites 2 and 4 as shown in FIG. 1. The description of the events occurring and the structures being formed in each of the sites 1–4 will be understood to apply likewise to all other unshown sites of the device 10 of which the sites 1–4 are representative. With sites 2 and 4 masked and sites 1 and 3 unmasked, the device 10 is irradiated as indicated by the arrows with a selective dose of a conductivity altering material to implant ions of the material in the portions of the substrate in sites 1 and 3 just below the gate oxide 16. The implant dosage is of sufficient energy to penetrate the gate oxide 16 but insufficient to penetrate the photoresist mask 18 or the field oxide 14 to any significant extent. In the case of a P-type silicon substrate 12 of the present example, it is preferred that the conductivity altering material comprise an N-type dopant such as arsenic or phosphorus, and that the dosage be sufficient to change the conductivity type of the substrate 12 to produce N-type regions 20 and 22 as indicated by the stippling in sites 1 and 3.

Subsequent to the implant step of FIG. 1, a new mask arrangement is formed as illustrated by FIG. 2 wherein sites 1 and 4 are masked against irradiation with photoresist, and sites 2 and 3 are unmasked. Then the device 10 is implanted with a second selective dose of preferably the same doping material as indicated once by the arrows. Thus an N-type region 24 is formed in site 2, and the concentration of N-type impurities is increased in region 22 of site 3. Accordingly the selective implant steps of FIGS. 1 and 2 produce four different groups of sites which 1–4 are representative, wherein site 1 receives only the first implant dose, site 2 receives only the second implant dose, site 3 receives the combined effect of both implant doses, and site 4 receives neither implant dose. The two successive steps of selective implantation using different masking patterns illustrated by FIGS. 1 and 2 permit MOSFETs having four different threshold voltages to be produced on the single substrate 12.

FIG. 3 illustrates the device 10 at a final stage in the manufacturing process wherein a MOSFET is formed in each of the sites 1–4. The MOSFETs may be formed by any known technique, as for example, the technique described in commonly assigned U.S. patent application Ser. No. 759,803, filed Jan. 17, 1977. Each MOSFET comprises source and drain regions 26 and 28, which in this example are N-type conductivity. Heavily doped polycrystalline silicon is preferably used to form gates 30, which are disposed on the gate oxide layers 16 as shown. Aligned below the gates 30 are channels 31, 32, 33 and 34, each of which imparts a different characteristic to the MOSFET formed in the corresponding site. Electrodes 36 and 38, preferably formed by a known aluminum metallization process, make electrical contact to source and drain regions 26 and 28 as shown. Likewise, gate electrodes 40 make electrical contact to the silicon gates 30 through an insulating layer 42, which also serves to stabilize the device 10 in accordance with known techniques. Additional passivating material (not shown) typically covers the device 10 in a manner known to those skilled in the art.

The presently most preferred method of practicing the invention gives rise to the formation of high performance circuits having interconnected MOSFETs of differing characteristics. The conductivity of the P-type starting material of the silicon substrate 12 and the dosage levels of the N-type implant are selected to produce the four MOSFET types having the operational modes and the approximate threshold voltages given in the following table:

| SITE | THRESHOLD VOLTAGE | MOSFET TYPE | IMPLANT DOSE 1 | IMPLANT DOSE 2 |
|---|---|---|---|---|
| 1 | −1.0V | Slightly Depletion | Unmasked | Masked |
| 2 | −3.8V | Standard Depletion | Masked | Unmasked |
| 3 | −4.8V | Highly Depletion | Unmasked | Unmasked |
| 4 | +0.75V | Standard Enhancement | Masked | Masked |

The selection of the various threshold voltages $V_T$ that are actually used is a matter of circuit performance criteria. The values for $V_T$ shown in the above table are presently preferred in integrated circuit applications involving state-of-the-art microprocessors. It should be noted that the combined effect of receiving both selective implants in site 3 produces a MOSFET whose $V_T$ is very near to the arithmetic sum of the site 1 and site 2 values for $V_T$.

The availability of the four MOSFET types permits flexibility in designing circuits using more than just the two standard MOSFETs previously available. Those skilled in the art will appreciate that the implant steps illustrated by FIGS. 1 and 2 are not necessarily the only implant steps used; however, both of the illustrated implant steps are selective with respect to the channels of different MOSFETs. The procedure heretofore has been to use only one selective ion implant step, thereby producing two types of MOSFETs, as for example by the method of U.S. Pat. No. 3,898,105. By using a second selective implant step in accordance with the present invention, two additional types of MOSFETs are produced. It is presently preferred that the two additional types operate in the depletion mode as will become apparent from the circuit applications discussed below. However, the inventive method can be used to make four different types of MOSFETs, each of which may operate in either the enhancement mode or depletion mode depending on the circuit application.

Now referring to FIG. 4, a conventional inverter circuit, generally indicated by reference numeral 100, will be used to illustrate the manner in which the availability of two additional types of depletion mode devices permits improvements in circuit performance and chip space utilization as compared with an inverter using standard devices. The operation of the circuit 100 is familiar to those skilled in the art. Briefly, transistor Q1 is a standard depletion mode device having its gate connected to its source at an output node 102. Transistor Q2 is a standard enhancement mode device having its drain connected to the output node 102 and its gate serving as an input 104. The circuit 100 is connected across conventional drain and source voltages, designated $V_{DD}$ and $V_{SS}$ respectively, with the source voltage in this case being ground potential. Hereinafter, the term "high" refers to a logic voltage level near the drain voltage $V_{DD}$, and the term "low" refers to a logic voltage level near the source voltage $V_{SS}$. The actual voltage levels used and the polarities thereof are known to those skilled in the art. In the event that N-channel MOSFETs are used as circuit elements, $V_{DD}$ will be a positive voltage, typically +5 volts. The present invention, however, is equally applicable to P-channel MOSFETs, which operate in a similar manner but with the opposite voltage polarities.

An example of an application for the highly depletion device ($V_T = -4.8$ volts) as a replacement for the standard depletion device ($V_T = -3.8$ volts) is increasing the switching speed (assuming no change in device size) for a low-to-high transition on the output node 102. The speed with which the output 102 can be pulled up is proportional to the amount of current conducted by transistor Q1, given some value of output capacitance. Since, for devices of identical size, the charging current through Q1 is greater for a $V_T$ of greater magnitude, substituting a highly depletion device for a standard depletion device results in a reduced response time.

An example of an application for the slightly depletion device ($V_T = -1.0$ volts) as a replacement for the standard depletion device is reducing the chip space allocated to Q1. Take for example the particular circuit implementation of FIG. 4 in which Q1 is a standard depletion device having a channel of 5 microns in width and 30 microns in length, and Q2 is a standard enhancement device having a channel of 5 microns in width and 5 microns in length. Approximately the same circuit operating characteristics can be achieved using a slightly depletion device for Q1 in place of the standard depletion device, wherein the slightly depletion device has a channel of 5 microns in width and 6 microns in length. Thus, the availability of a slightly depletion device may in certain cases enable a substantial reduction in chip space.

Furthermore, in the case where transistor Q1 is already at a minimum size using a standard depletion device, it is possible to reduce the size of transistor Q2. This will also result in a reduced switching speed, which in certain cases may not be an impediment. Take for example the particular circuit implementation in which Q1 is a standard depletion device having a channel of 5 microns in width and 5 microns in length, and Q2 is a standard enhancement device having a channel of 30 microns in width and 5 microns in length. Using a slightly depletion device of the same size for Q1 in place of the standard depletion device, essentially the same quiescent logic levels can be produced on the output 102 using a transistor Q2 with a reduced width measuring 5 microns. The actual low-logic level on output 102 of course depends upon how hard Q2 is driven on at the input 104.

Figure 5:
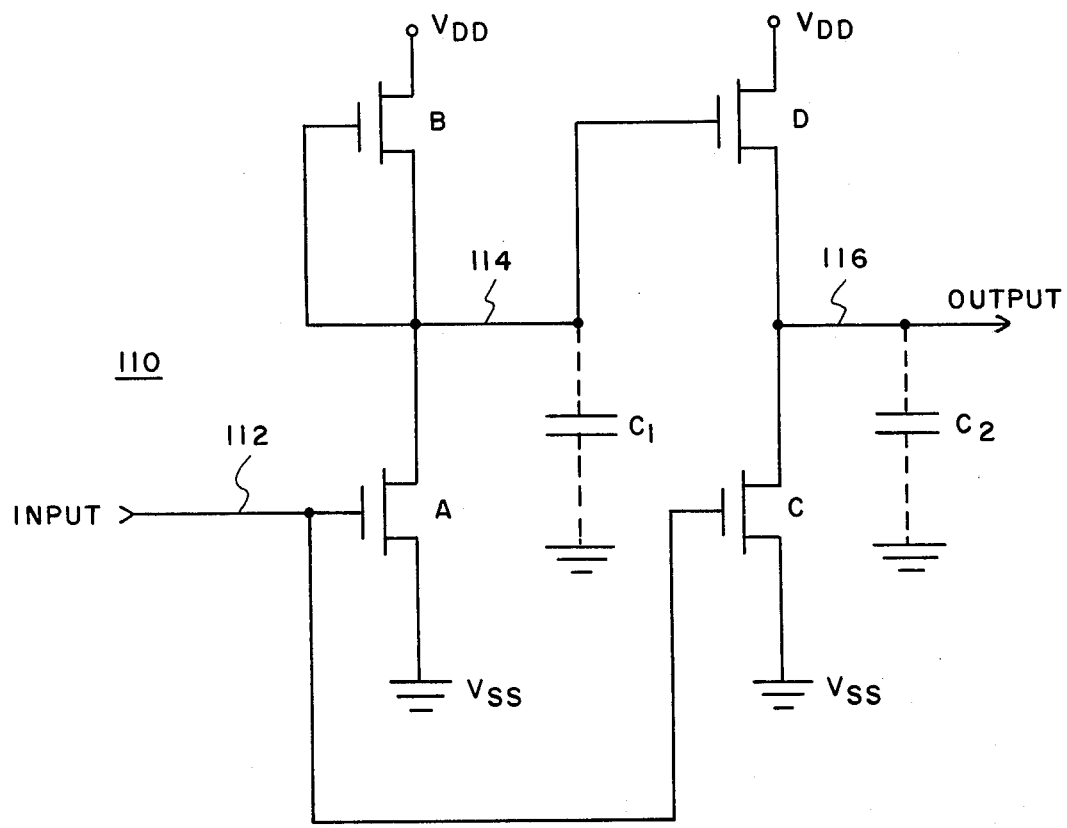

Now referring to FIG. 5, another circuit application of the present invention is shown. The circuit, generally indicated by reference numeral 110, is a type of inverter known as a push-pull buffer. In the prior-art implementation of circuit 110 as described in U.S. Pat. No. 3,775,693, transistors A and C are standard enhancement mode MOSFETs, transistor B is a standard depletion mode MOSFET, and transistor D may be either standard enhancement or standard depletion. Transistors A and B comprise a first inverter stage, and transistors C and D comprise a second inverter stage or push-pull stage.

An input voltage at node 112, whether high or low, is inverted at output nodes 114 and 116, with node 116 being the output of the circuit 110. The nodes 114 and 116 have stray capacitances $C_1$ and $C_2$, which place inherent limitations on the switching speeds between logic levels. $C_2$ is referred to as the load capacitance of the circuit 110 and is usually much greater than $C_1$.

A significant improvement in the operation of circuit 110 is achieved by using a slightly depletion type MOSFET for device D. Depending on the geometry selected for device D, the improvement may manifest itself as either a reduction in response time, or a reduction in power consumption, or some optimum combination thereof. An ancillary benefit in many cases will be a reduction in chip space utilization.

Those skilled in the art will appreciate that for the logic state wherein the input 112 is high, devices A and C are on and current flows continually through both inverter stages (i.e., for the case where device D is depletion type). In order to pull nodes 114 and 116 low, device A is made much more conductive than device B, and device C is made much more conductive than device D, so that most of the voltage drop between $V_{DD}$ and $V_{SS}$ appears across devices B and D.

Assume that the objective in replacing a standard depletion MOSFET with a slightly depletion MOSFET for device D is to effect a power savings without altering the response time. The new width to length ratio W/L for device D would be selected to be equal to the product of the old W/L times the ratio of effective turnon voltage for the standard depletion device to that of the slightly depletion device. The effective turn-on voltage is equal to the difference between the average gate-to-source voltage on device D during the relevant transitional period from low to high on node 116 and the threshold voltage of device D. That is:

$$(\frac{W}{L}) \text{ new} = (\frac{W}{L}) \text{ old} \times \frac{V_{GS} - \text{old } V_T}{V_{GS} - \text{new } V_T}.$$

For example, assume that the relevant transitional period for measuring the response time is from a low output state of 0.4 volts to a level of 2.4 volts, which is typically the minimum voltage needed to be sensed as "high" on node 116. Also assume that node 114 is pulled all the way to $V_{DD}$ (i.e., +5 volts) in a small fraction of the response time. Then the average $V_{GS}$ on device D during the transition from 0.4 volts to 2.4 volts on node 116 would be about 3.6 volts. Therefore:

$$(\frac{W}{L}) \text{ new} = (\frac{W}{L}) \text{ old} \times \frac{3.6 - (-3.8)}{3.6 - (-1.0)} = 1.6 \times (\frac{W}{L}) \text{ old}$$

The power savings in the C-D inverter stage may now be computed. When device C is on, the current through device D is proportional to its W/L times the square of its turn-on voltage. Assuming $V_{GS}$ for device D is zero for the quiescent state when device C is on and ignoring any back-gate effect, then:

$$\text{Power savings factor} = \frac{I \text{ old}}{I \text{ new}} =$$

$$\frac{(\frac{W}{L}) \text{ old} \times (\text{old } V_T)^2}{(\frac{W}{L}) \text{ new} \times (\text{new } V_T)^2} = \frac{1}{1.6} \times (\frac{3.8}{1})^2 = 9.0$$

Therefore, in the above example, a slightly depletion device D may be substituted for a standard depletion device D so that the same response time is achieved while the power consumed during the low output state is about 9 times lower.

An additional benefit of using the slight depletion MOSFET for device D is that the device D will be pinched off for most of the transition from high to low on output node 116, thereby enabling device C to pull node 116 low without having to pull against device D during the important initial part of the transition. Those skilled in the art will appreciate that device D will be pinched off as soon as its gate-to-source voltage becomes more negative (for the case of N-channel MOSFETs) than its threshold $V_T$. The gate-to-source voltage for device D is the difference between the voltages on nodes 114 and 116. Since node 114 is typically pulled down much faster than node 116 when devices A and C turn on, device D is quickly pinched off and remains off until node 116 comes down to a voltage level relative to node 114 that is less than the magnitude of the threshold voltage of device D. Therefore, node 116 can be pulled down faster in the case where device D is a slightly depletion MOSFET than for the standard depletion MOSFET.

Although preferred embodiments of the invention have been described in detail, it is to be understood that various changes, substitutions and alterations can be made therein without departing from the spirit and scope of the invention as defined in the appended claims.

What is claimed is:

1. An integrated circuit for inverting a binary logic signal comprising:
    a first depletion mode FET coupling a drain voltage to a first output node, the gate of the first depletion mode FET being connected to the first output node,
    a first enhancement mode FET coupling the first output node to a source voltage, the gate of the first enhancement mode FET being connected to an input terminal,
    a second depletion mode FET coupling a drain voltage to a second output node, the gate of the second depletion mode FET being connected to the first output node, and
    a second enhancement mode FET coupling the second output node to a source voltage, the gate of the second enhancement mode FET being connected to the input terminal,
    wherein the absolute value of the threshold voltage of the second depletion mode FET is less than the absolute value of the threshold voltage of the first depletion mode FET.

2. The integrated circuit of claim 1 wherein the absolute value of the threshold voltage of the second depletion mode FET is substantially less than the difference between the high and low logic levels, whereby the second depletion mode FET will be pinched-off during most of the transition from the high logic level to the low logic level of the second output node.

* * * * *